MASKING DEVICE USEFUL FOR MAKING TRANSISTORS

Filed Oct. 20, 1959

INVENTOR

Elmer A. Wolff, Jr.

BY Stevens, Davis, Miller & Mosher

ATTORNEYS

United States Patent Office 3,088,435

Patented May 7, 1963

3,088,435
MASKING DEVICE USEFUL FOR MAKING TRANSISTORS

Elmer A. Wolff, Jr., Richardson, Tex., assignor to Texas Instruments Incorporated, Dallas, Tex., a corporation of Delaware Filed Oct. 20, 1959, Ser. No. 847,516
2 Claims. (Cl. 118—504)

The present invention relates to a novel masking device useful in the production of transistors. More particularly, the present invention relates to a unique masking device and the technique with which it is employed when forming alloyed contacts on the surface of a wafer of semiconductor material.

In the production of semiconductor devices, one technique presently in vogue involves diffusing impurity atoms into one surface of a semiconductor wafer of a predetermined conductivity type to form a PN diffusion junction. Thereafter, pairs of contacts are placed onto the diffused surface, one contact forming an ohmic connection and the other contact forming a rectifying connection. These two contacts constitute the base and emitter contacts and are arranged on the diffused surface in closely spaced relation. The contacts are quite small and may take any convenient form, regular or irregular. For example, they may be small bars having dimensions approximately 1 mil x 3 mils. It will be appreciated, however, that there is no limitation upon the shape of the contacts nor upon their size. Since devices of this type are usually employed at high frequencies, the contact areas are made as small as possible and hence their spacing is quite critical.

There are essentially three techniques now available to form the alloyed contacts on the surface of the wafer. In one technique, two different masks are employed. The first mask defines an opening corresponding in position to one contact of the pair of contacts to be applied to the diffused surface of the wafer. The second mask defines an opening corresponding in position with the second contact of the pair of contacts. The first mask is placed over the semiconductor wafer and the assembly is placed into a vacuum jar or the like and a suitable material is deposited by an evaporation technique through the opening in the mask onto the surface of the semiconductor wafer to form an alloyed contact. Thereafter, the first mask is removed and the second mask placed over the work, and by a similar procedure a second material is evaporated onto the surface of the wafer.

A second technique involves spacing a mask having one opening slightly above the work and using the parallax created by the spaced arrangement to obtain two closely spaced contacts. As before, an evaporation technique is employed. Materials from two spaced sources are evaporated onto the surface of the wafer through the opening in the mask. Since the sources of material are maintained in fixed positions above and with respect to the surface of the semiconductor wafer and the mask is spaced slightly above the semiconductor wafer, there will be a different exposure area for each of the two sources. The lateral offset of the exposure areas will produce the spacing between the deposited contacts. The technique, by its very nature, is restricted to using a very small area for the semiconductor wafer surface. The spacing of the contacts on the surface of the wafer, due to the use of parallax evaporation techniques as described, is a function of the position of the deposited contacts with respect to the two sources that are employed. The spacing of deposited contacts will vary depending upon the location of the exposure areas in a lateral or transverse sense with reference to the two sources of material.

A third technique described in a copending joint application of this inventor and Boyd Cornelison, Serial No. 847,631, filed even date herewith involves placing a mask flat on the work, the semiconductor wafer, evaporating a contact onto the work through an opening defined in the mask and then moving the work and mask relative to each other a distance corresponding to the distance desired between contacts and then evaporating the second contact onto the surface of the wafer through the opening which is now at a new position. Unfortunately, it has been found that this technique, although the simplest, most economical and best from a practical and workable standpoint, nevertheless is very unsatisfactory. Most of the materials normally used for the mask have the disadvantage of bonding or alloying to the semiconductor wafer when elevated evaporation temperatures are used. Materials that resist bonding or alloying to the semiconductor wafer are generally exceedingly difficult to form into masks.

The materials often employed for the mask are nickel and Kovar, a trade name for an iron-nickel-cobalt alloy. Although nickel forms a eutectic with germanium at 750° C., it has been discovered in practice that very high purity nickel will form an alloy or bond with germanium at temperatures as low as 400° C. Since temperatures of 400 to 500° C. are frequently employed in an evaporation technique, it can readily be seen that using a nickel mask and placing it in intimate contact with a germanium semiconductor wafer is risky and could cause the loss of valuable material.

It is to solve this problem that the present invention was conceived. By means of the present invention, a way has been found to place a mask in intimate contact with a semiconductor wafer and to conduct an evaporation process at temperatures above 400° C. without the danger of the mask bonding or alloying to the semiconductor wafer. Hence it is possible to take full advantage of the third described technique.

This is essentially accomplished, by means of the present invention, by depositing or coating the surface of the mask to be placed against the surface of the semiconductor wafer with a material which will prevent or inhibit any bonding or combination of the material of the mask and semiconductor material.

In a preferred form of the present invention, it has been discovered that carbon, deposited upon the face of a nickel mask, will successfully function to prevent the nickel mask from alloying or bonding to a germanium wafer during a deposition by evaporation process.

Accordingly, it is an object of the present invention to provide a novel masking device and fabrication technique which will enable a mask defining an opening to be placed directly in contact with a wafer of semiconductor material during the deposition and alloying of a metal contact, thereafter the mask and work may be moved relatively a distance corresponding to the desired spacing between contacts and a second metal contact deposited onto the semiconductor wafer. The mask is treated by coating the surface adjacent the wafer with a material, preferably carbon, which will successfully prevent bonding or alloying of the mask with the semiconductor wafer.

Other objects and advantages of the present invention will become more fully apparent from the following detailed description of a single preferred embodiment of the present invention when taken in conjunction with the appended drawings, in which.

Figures 2, 3:
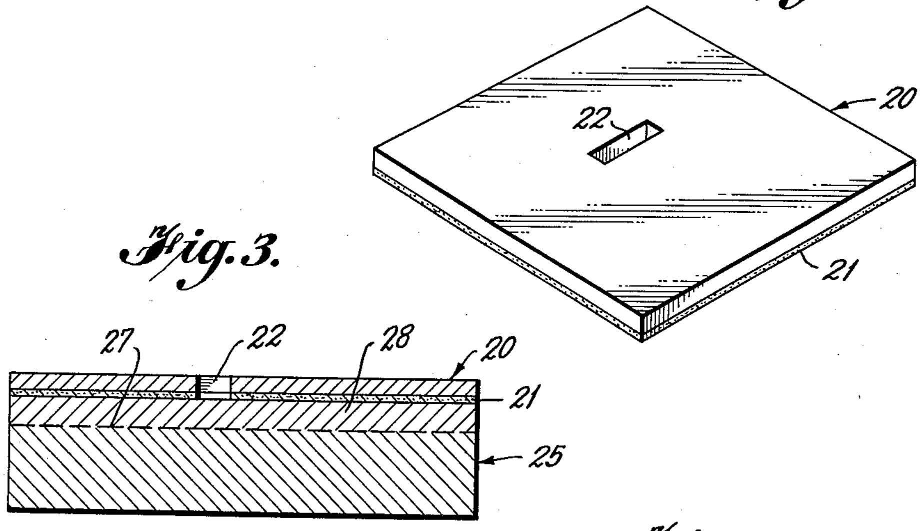
FIGURE 2 illustrates in perspective a nickel mask prepared according to the principles of the present invention.
FIGURE 3 illustrates in section the nickel mask of FIGURE 2 placed upon a germanium semiconductor wafer containing a diffused junction substantially parallel with one surface.
Figure 4:
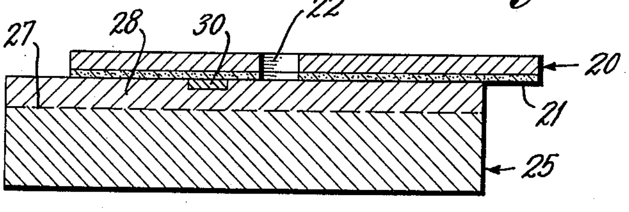
Figure 5:
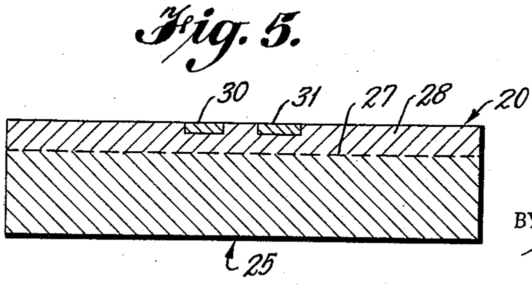

FIGURE 4 illustrates in section the assemblage of FIGURE 3 after an alloyed contact has been deposited onto the surface of the germanium wafer and the nickel mask and germanium wafer have been moved relatively to one another so that the opening of the mask rests at a new position with reference to the surface of the wafer; and FIGURE 5 illustrates in section the completed semiconductor wafer after the second evaporation.

Referring now to the drawings, a specific preferred embodiment will be described in detail to enable one skilled in the art to be able to practice the present invention.

Figure 1:
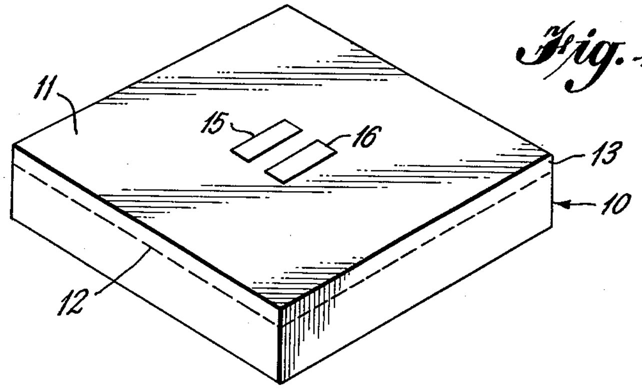
FIGURE 1 illustrates in perspective a semiconductor wafer into one surface of which has been alloyed a pair of metal contacts.

Reference is first made to FIGURE 1 which shows a germanium semiconductor wafer 10 of P type conductivity. Diffused into the upper surface 11 of the wafer 10 are antimony impurity atoms in an amount sufficient to convert a layer 13 of material adjacent the upper surface 11 to N type conductivity and to define between the regions of P and N type conductivity a PN diffused junction as illustrated by the dotted line 12. Formed onto the diffused surface 11 are two contacts 15 and 16. Each of the contacts is in the form of a rectangle and has dimensions approximately 0.001 inch x 0.003 inch. The two bars 15 and 16 are substantially parallel and are spaced apart a distance corresponding to approximately 0.001 inch. The two bars are deposited onto the diffused surface 11 by means of a conventional evaporative technique conducted under vacuum conditions and are alloyed with the surface 11 of the wafer 10. The bar 15 is composed of aluminum and, hence, forms an emitter (rectifying) connection with the N type conductivity diffused surface 11. The bar 16 is composed of a gold-antimony alloy containing a minor percent of antimony. The amount, however, is sufficient so that the bar 16, when alloyed with the diffused surface forms therewith an ohmic contact. Hence, a PNP transistor results consisting essentially of an emitter in the form of bar 15, a base region constituted by diffused layer 11, and a collector region constituted by the main portion of the germanium wafer 10. The collector contact has not been shown in FIGURE 1. However, it will be appreciated that any suitable contact may be made to the bottom surface of the wafer 10 in order to form an ohmic electrical connection therewith.

In the fabrication of the device as illustrated in FIGURE 1, it is necessary that the contacts 15 and 16 be evaporated onto the surface 11 of the wafer. This is essentially accomplished in a unique way by means of the principles of the present invention. A mask, defining a single opening, is placed upon the surface of the semiconductor wafer 10 in intimate contact with the diffused surface 11. The semiconductor wafer is heated to an alloying temperature and a material is then simultaneously evaporated and alloyed onto the surface 11 in order to form one of the contacts. Thereafter, the mask and work (wafer 10) are moved relatively to one another and the second contact is formed by an evaporating and alloying technique similar to the first. The difficulty, however, with conducting the process exactly as described is that the material of the mask and the semiconductor material alloy or bond at the temperatures employed in the deposition and alloying of the materials to form the contacts 15 and 16. Accordingly, it is necessary to modify the process in order to avoid all the disadvantages and problems inherently involved. The modification required concerns the use of a material to insulate protectively the surface of the mask which lies adjacent to the surface of the work. It has been discovered that carbon is the preferred material for carrying out the purposes and desires of the present invention.

There is illustrated in FIGURE 2 a typical nickel mask 20 provided with a single opening having dimensions approximately 0.001 inch x 0.003 inch. The nickel mask 20 is provided, in accordance with the principles of the present invention, with a carbon film 21 completely coating the lower face of the mask. The film is as thin as possible. The nickel mask 20 with the film 21 is then placed into intimate contact with a wafer of semiconductor material 25, such as illustrated in FIGURE 3, so that the opening, identified in FIGURE 3 by the numeral 22, is positioned to leave exposed an area of the diffused surface 26 of the wafer 25. The mask 20 is placed on the wafer 25 with the carbon film 21 in intimate contact with the surface of the wafer. The wafer illustrated in FIGURE 3 is like the one shown in FIGURE 1 in that it includes a PN diffused junction identified by the reference numeral 27. The layer of the wafer above the junction 27 constitutes a diffused region or base layer and has been identified by the numeral 28. Reference numeral 26 is used to designate the diffused surface of the wafer 25.

The mask 20 and wafer 25 are assembled, as shown in FIGURE 3, and placed in a bell jar or other suitable apparatus so that metal or other suitable material may be evaporated upon the diffused surface 26 through the opening 22. During this process, the wafer is heated to from about 400 to about 500° C. so that as the material is deposited on surface 26, it alloys with the diffused layer 28 and forms a contact, such as the bar 16. The alloyed contact so formed is shown in FIGURE 4 and is designated by the reference numeral 30. Subsequent to the formation of the alloyed contact 30, the assembly is then manipulated within the vacuum chamber, so that the wafer 25 and mask 20 are moved relatively to each other to offset the opening 22 with reference to the surface 26. Actually, the movement of the mask and work relatively to one another is such as to position the opening 22 with respect to the surface 26 so that it will be laterally displaced a distance from the contact 30 corresponding to the critical spacing desired between contacts. As illustrated in FIGURE 4, the contact 30 has a width of approximately 0.001 inch and the opening 22 is laterally displaced and repositioned on surface 26 a distance of 0.001 inch from the closest edge of the contact 30. With the mask opening in the new position, another material or metal is evaporated onto the surface 26 of the wafer 25 through the opening 22 in the position shown in FIGURE 4 and alloyed to the wafer. As a result, there will be formed on the surface 26 a second contact 31 having a width equal to the width of the opening 22. The two contacts 30 and 31 will be critically spaced as desired. These contacts 30 and 31 will function as the emitter and base contacts, respectively, for the transistor device.

The wafer 25 as shown in FIGURES 3 to 5 inclusive may be a germanium semiconductor wafer of P type conductivity with an N type diffused region formed therein precisely as described with reference to FIGURE 1. The contacts formed on the surface may be aluminum for contact 30 and gold-antimony for contact 31, also as described with reference to FIGURE 1.

It will be appreciated that the key feature of the process is the inclusion of a protective film, such as the thin carbon film 21, to prevent the mask, such as the nickel mask 20 from alloying or bonding with the semiconductor body (germanium wafer 25) as a result of the various evaporation and deposition processes. The invention is not limited to the use of a nickel mask since any other suitable material, such as steel, molybdenum, Kovar and others may be used. Also, protective films other than carbon may be used to prevent the mask alloying or bonding to the semiconductor wafer.

Although germanium has been described as the semiconductor material, it will be appreciated that other semiconductor materials may be employed and are within the contemplation of the invention. Thus silicon, intermetallic alloys and any other suitable materials are included.

Also, there is no limitation as to the device produced. Although the formation of a PNP type transistor has been shown, the invention also applies to the formation of NPN types, as well as variations of NPN and PNP types which may or may not include intrinsic regions. The important consideration is that a means has been described and shown whereby the mask and work may be placed in intimate contact and may be relatively moved one with respect to the other without danger of bonding or alloying. The prime advantage that flows from this discovery is that contacts can be placed accurately and uniformly on a semiconductor body and perhaps equally as important, reproducibly.

Although the present invention has been shown and described with reference to a single preferred embodiment, it will be appreciated that changes and modifications may be made from a knowledge of the teachings of the present invention which do not, in truth and in fact, depart from the concepts of the invention. Hence the invention is not to be limited or restricted to precisely what is shown and described, but rather should be construed in the light of the fundamentally new principles as embodied in the teachings disclosed herein.

What is claimed is:

1. A mask for use in the fabrication of a semiconductor device comprising a thin metal plate defining an opening and a thin carbon film having a thickness much less than that of said plate on at least one surface of said plate to prevent bonding of said plate wtih a body of semiconductor material when the two are placed in intimate contact and brought to an elevated temperature, said plate having a thickness which is small relative to the thickness of the body of semiconductor material.

2. An evaporation mask for use in the fabrication of a semiconductor device comprising a thin nickel plate defining an opening and a very thin carbon film on at least one surface of said plate to prevent bonding of said plate with a body of semiconductor material when the two are placed in intimate contact and brought to an elevated temperature, said plate having a thickness which is small relative to the thickness of the body of semiconductor material.

References Cited in the file of this patent

UNITED STATES PATENTS 2,560,594 Pearson ---------------- July 17, 1951
2,781,481 Armstrong -------------- Feb. 12, 1957
2,858,246 Pearson ----------------- Oct. 28, 1958